(12) United States Patent
Miyamoto

(10) Patent No.: US 7,269,065 B2
(45) Date of Patent: Sep. 11, 2007

(54) NONVOLATILE SEMICONDUCTOR STORAGE APPARATUS AND READOUT METHOD

(75) Inventor: Kenichi Miyamoto, Miyazaki (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/936,523

(22) Filed: Sep. 9, 2004

(65) Prior Publication Data
US 2005/0078499 A1    Apr. 14, 2005

(30) Foreign Application Priority Data
Oct. 8, 2003    (JP)    ............... 2003-349292

(51) Int. Cl.
G11C 11/34    (2006.01)
(52) U.S. Cl. .............. 365/185.17; 365/185.2; 365/185.21
(58) Field of Classification Search ........... 365/185.17, 365/185.18, 185.2, 185.21, 185.25, 185.29, 365/185.33, 210
See application file for complete search history.

(56) References Cited

U.S. PATENT DOCUMENTS

| 5,373,477 | A | * | 12/1994 | Sugibayashi | ............... | 365/210 |
|---|---|---|---|---|---|---|
| 5,717,640 | A | * | 2/1998 | Hashimoto | ............... | 365/185.2 |
| 6,108,259 | A | * | 8/2000 | Choi et al. | ............. | 365/185.21 |
| 6,163,484 | A | * | 12/2000 | Uekubo | ................... | 365/185.2 |
| 6,215,697 | B1 | * | 4/2001 | Lu et al. | .................. | 365/185.2 |
| 6,246,621 | B1 | * | 6/2001 | Miyamoto | .................. | 365/210 |
| 6,337,825 | B2 | * | 1/2002 | Tanzawa et al. | ........ | 365/185.21 |
| 6,751,124 | B2 | * | 6/2004 | Lee | ........................ | 365/185.18 |

FOREIGN PATENT DOCUMENTS

JP    2000-306392    11/2000

\* cited by examiner

*Primary Examiner*—Trong Phan
(74) *Attorney, Agent, or Firm*—Donald R. Studebaker; Nixon Peabody, LLP

(57) ABSTRACT

A semiconductor storage apparatus includes a plurality of data cells arranged in rows and columns. The data cells have MOS transistors having different types of operating characteristics to store data according to the types of the MOS transistors. Bit lines extend to the respective columns of data cells. The stored data is read out according to a cell current arising in the bit lines. One among the bit liens is taken as a reference bit line, and the bit line cell currents in the remaining bit lines are adjusted according to the value of the cell current arising in the reference bit line.

8 Claims, 9 Drawing Sheets

NONVOLATILE SEMICONDUCTOR STORAGE APPARATUS AND READOUT METHOD

BACKGROUND OF THE INVENTION

1. Field of the Invention

The present invention relates to a semiconductor storage apparatus that includes a nonvolatile memory cell, and also relates to a readout method for such storage apparatus.

2. Description of the Related Art

Japanese Patent Kokai (Laid-open publication) No. 2000-306392 discloses a semiconductor storage apparatus which includes an MROM (Mask Read-Only Memory) as a nonvolatile memory. This semiconductor storage apparatus has an array of NAND-type memory cells and a current detection-type sense amplifier, as shown in FIG. 7 of the accompanying drawings. The array of NAND-type memory cells includes two types (NMOS and DMOS) of transistors with different on resistances and threshold values to hold individual bits of stored data. The memory cell array includes a plurality of data cells arranged in an array. Data cells are selected by word lines (WL) which specify rows, and control gates (CG) which specify columns.

Readout of stored data from such a semiconductor storage apparatus is generally carried out as follows: when a certain word line is selected, the data cells of the data cell portion of the column selected by the control gate and the data cell of the reference cell portion for reference potential generation are simultaneously selected. Then, a reference voltage Vref occurs in a reference potential generation circuit due to a reference current Iref flowing from the reference cell portion. By comparing this reference voltage Vref with a voltage obtained by amplifying, in a data detection circuit, the cell current Icell flowing from the data cell portion, the output data Vsa is produced.

Such NAND-type memory cells include NMOS transistors which are ordinary N-channel transistors adapted to store "L" data, and DMOS transistors which are depletion-type transistors adapted to store "H" data. A DMOS transistor has a threshold Vt lower than an ordinary NMOS transistor, and is in the on state whether the gate voltage is H (high) or L (low). The transistor on resistance is higher for an NMOS than for a DMOS transistor. Because the on resistance of the DMOS transistor is lower, the greater the number of DMOS transistors among a plurality of data cells connected on the same bit line, the lower is the total series resistance of the bit line. A larger cell current flows when the total series resistance of the bit line is smaller.

Hence, some of the columns selected through control of the control gate may differ from other columns in the cell current flowing in the bit line even when the "H" readout is equally performed on these columns. Also, when the current is large, overshoot or undershoot may occur in the "H" output, resulting in erroneous data output or in access delays, as shown in FIG. 8 of the accompanying drawings.

In FIG. 8, Rcdv SMALL indicates when the resistance Rcdv is small, and Rcdv LARGE indicates when the resistance Rcdv is large. The vertical axis of the graph (FIG. 8) indicates Icell[µA] which his a cell current with the unit of µA. µA is micro-ampere. The horizontal axis of the graph (FIG. 8) indicates VCC[V] which is a voltage to be supplied to the cell, with the unit of V. V is volt. Icell 16DMOS represents the cell current flowing when the data cell portion includes sixteen DMOSs, and Icell 1DMOS represents the cell current flowing when the data cell portion includes a single DMOS. CURRENT DIFFERENCE LARGE indicates that the difference between the Icell 16 DMOS and Icell 1DMOS is large, and CURRENT DIFFERENCE SMALL indicates that the difference between the Icell 16DMOS and Icell 1DMOS is small.

A method of overcoming this difficulty is known. It employs a resistance Rcdv which sets the cell supply voltage CELLVCC to an arbitrary level through the voltage drop across the resistance. The resistance Rcdv greatly reduces the maximum cell current, and the minimum cell current declines gradually compared with the maximum cell current, as shown in FIG. 9 of the accompanying drawings. That is, the resistance Rcdv reduces the difference between the minimum cell current and the maximum cell current.

In FIG. 9, UNDERSHOOT indicates where the undershoot occurs, and DISCHARGE DELAY indicates where the discharge delay occurs.

SUMMARY OF THE INVENTION

Even when this approach is used, however, a problem arises if a circuit has a number of sense amplifiers and performs high-speed readout of data from the amplifiers. Specifically, the cell current Icel flows all at once according to the number of sense amplifiers, so that a voltage drop equal to the resistance Rcdv times the cell current Icell occurs if a certain type of resistance Rcdv is used. This impedes operation of the entire semiconductor storage apparatus because it becomes impossible to supply an appropriate cell voltage CELLVCC to the memory cell array.

One object of this invention is to provide a semiconductor storage apparatus which does not generate erroneous data and does not suffer from access delays so that the semiconductor storage apparatus can operate in a stable manner.

Another object of this invention is to provide a readout method for a semiconductor storage apparatus, which can stabilize the operation of the entire semiconductor storage apparatus.

According to a first aspect of the invention, there is provided an improved semiconductor storage apparatus. This apparatus includes a memory cell array having a plurality of data cells arranged in a plurality of rows and a plurality of columns. The data cells include a plurality of MOS transistors having different types of operating characteristics to store data according to the operating characteristics types. The MOS transistors in each column are connected to each other in series such that a source of one MOS transistor is coupled to a drain of next MOS transistor. The semiconductor storage apparatus also includes a plurality of bit lines. Each bit line is defined by the MOS transistors in each column. A cell current flows in each bit line. The semiconductor storage apparatus also includes readout means for reading the stored data from one of the data cells based on a cell current occurring in one of the bit lines. The semiconductor storage apparatus also includes current adjustment means for taking one among the bit lines as a reference bit line, and for adjusting, in accordance with the cell current occurring in the reference bit line, the cell currents flowing in the remaining bit lines.

A current-limiting potential is prepared by the adjustment means. Based on the current-limiting potential, excessive flow of the currents in the semiconductor storage apparatus are prevented during reading of the stored data. As a result, erroneous output of data and access delays can be avoided.

According to a second aspect of the invention, there is provided another improved semiconductor storage apparatus. This semiconductor storage apparatus includes a memory cell array having a plurality of data cells arranged in a plurality of rows and a plurality of columns. The data cells include a plurality of MOS transistors having different types of operating characteristics to store data according to the operating characteristics types. The MOS transistors in each column are connected to each other in series such that a source of one MOS transistor is coupled to a drain of next MOS transistor. The semiconductor storage apparatus also includes a plurality of bit lines. Each bit line is defined by the MOS transistors in each column such that a cell current flows in each bit line. The semiconductor storage apparatus also includes readout means for reading the stored data from one of the data cells based on a cell current occurring in one of the bit lines. The semiconductor storage apparatus also includes a step-down circuit connected to all of the bit lines for supplying a constant voltage regardless of values of the cell currents on the bit lines. The step down circuit prevents excessive flow of the currents in the semiconductor storage apparatus during reading of the stored data. As a result, erroneous output of data and access delays can be avoided.

According to a third aspect of the present invention, there is provided a method of reading data from a semiconductor storage apparatus based on a cell current appearing on one of a plurality of bit lines of the semiconductor storage apparatus. The semiconductor storage apparatus includes a memory cell array having a plurality of data cells arranged in a plurality of rows and a plurality of columns. The data cells include a plurality of MOS transistors having different types of operating characteristics to store data according to the operating characteristics types. The MOS transistors in each column are connected to each other in series such that a source of one MOS transistor is coupled to a drain of next MOS transistor. Each bit line is defined by the MOS transistors in each column such that a cell current flows in each bit line. The method includes taking one of the bit lines as a reference bit line. The method also includes adjusting the cell currents flowing in the remaining bit lines in accordance with the cell current flowing in the reference bit line. The method can prevent errors in the stored data and avoid access delays.

These and other objects, aspects and advantages of the present invention will become apparent to those skilled in the art from the following detailed description and appended claims when read and understood in conjunction with the accompanying drawings.

DETAILED DESCRIPTION OF THE INVENTION

Embodiments of this invention are described in detail, referring to the attached drawings.

First Embodiment

Figure 1:
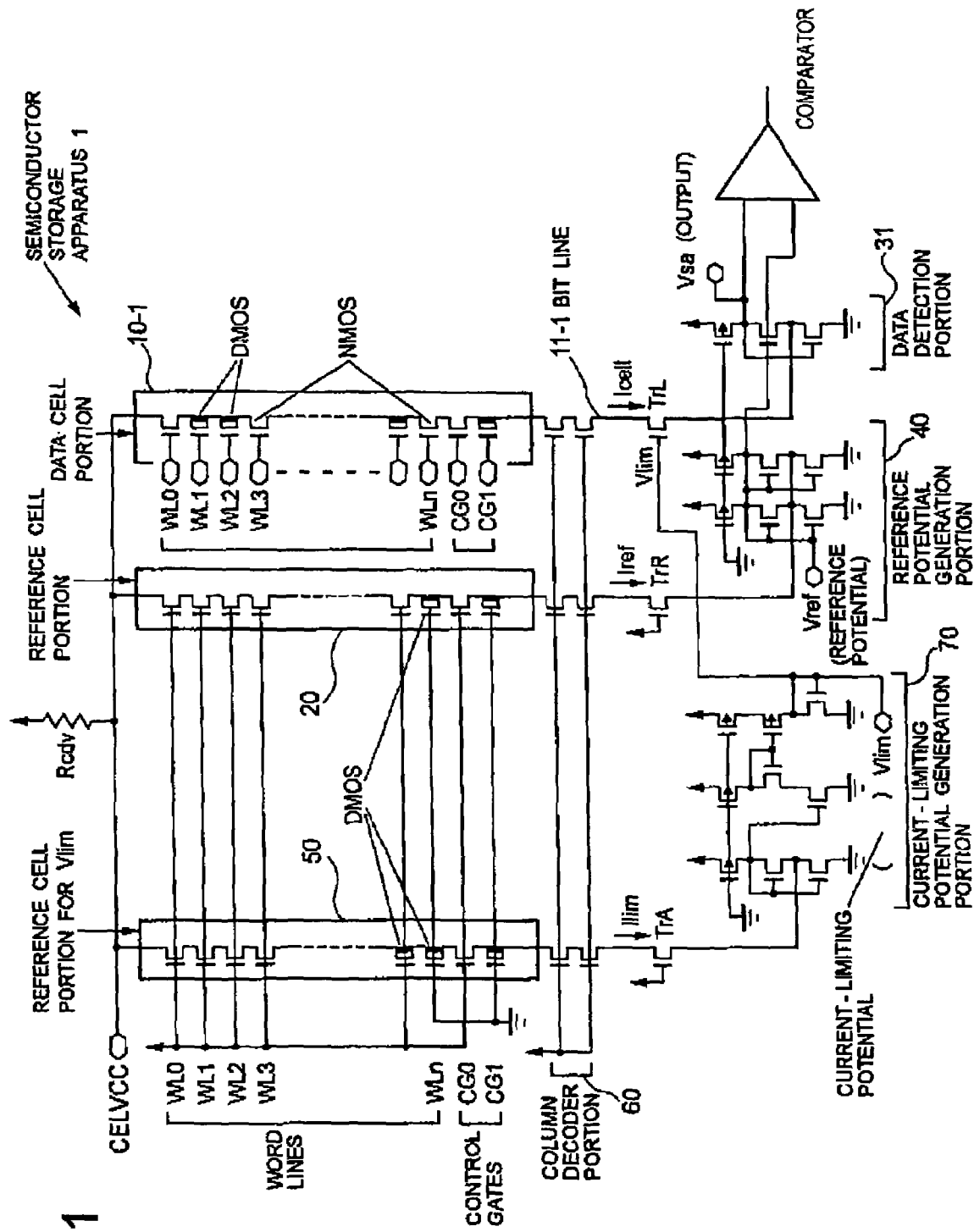
FIG. 1 is a circuit diagram showing the circuit configuration of a semiconductor storage apparatus in a first embodiment of this invention.

Referring to FIG. 1, the configuration of a semiconductor storage apparatus 1 is described. The semiconductor storage apparatus 1 includes a NAND memory cell array. This memory cell array includes a plurality of data cells in a matrix of n rows by m columns (where n and m are natural numbers). Each data cell is either an NMOS transistor storing "L" data, which is an ordinary N-channel transistor, or a DMOS transistor storing "H" data, which is a depletion-type transistor, so that each data cell stores either "1" or "0". The on resistance of an NMOS transistor is greater than the on resistance of a DMOS transistor. Hence the memory cell array of the semiconductor storage apparatus 1 has a plurality of data cells of different operating characteristics.

The semiconductor storage apparatus 1 has m data cell portions, 10-1 through 10-m, corresponding to the number of columns m. Each of the data cell portions 10-1 through 10-m includes n data cells. In FIG. 1, for the sake of simplification, only one data cell portion 10-1 is shown. Selection of the columns of the data cell portions 10-1 through 10-m is performed by the control gates CG0, CG1 and the column decoder portion 60, connected in series.

The semiconductor storage apparatus 1 also has a first reference cell portion 20 and a second reference cell portion 50. The second reference cell portion 50 obtains a current-limiting potential. A cell supply voltage CELLVCC is supplied to one end of each of the data cell portion 10-1, first reference cell portion 20 and second reference cell portion 50. The cell supply voltage CELLVCC is supplied from an external power supply via a resistance Rcdv. A plurality of word lines WL0 to WLn corresponding to the number of rows n are connected to the gates of the data cells of the data cell portion 10-1, respectively. The gates of the first reference cell portion 20 and the second reference cell portion 50 are held at "H" or at ground point in order that a reference current Iref constantly flows or a current-limiting potential Vlim always appears.

The other end of the data cell portion 10-1 is connected to a data detection portion 30 by a bit line 11-1 via the column decoder portion 60. The bit line 11-1 supplies the cell current Icell.

The other end of the first reference cell portion 20 is connected to the reference potential generation portion 40 via the column decoder portion 60 and transistor TrR to supply the reference current Iref. The other end of the second reference cell portion 50 is connected to the current-limiting potential generation portion 70 via the column decoder portion 60 and transistor TrA to supply the limiting current Ilim.

The data detection portion 30 compares the cell current Icell limited by the current-limiting transistor TrL with the reference voltage Vref supplied from the reference voltage generation portion 40, and produces the output data Vsa as the result of readout of the stored data. The reference potential generation portion 40 produces a reference voltage Vref according to the supplied reference current Iref.

The current-limiting potential generation portion 70 generates a current-limiting potential Vlim according to the limiting current Ilim flowing in via the transistor TrA. The current-limiting potential Vlim is introduced to the gate of the current-limiting transistor TrL, and the current-limiting transistor TrL limits the cell current Icell according to this potential. In other words, the current-limiting potential generation portion 70 and current-limiting transistor TrL constitute a current-limiting circuit.

Next, operation of the semiconductor storage apparatus 1 is described. In FIG. 1, the selected word line WL is assumed to be at level "L", and all other unselected word lines WL are assumed to be at level "H". Through this selection, the cell current Icell flows when the selected data cell is a DMOS device, but does not flow when the selected data cell is an NMOS device. Accordingly, the stored data can be read out.

The reference current Iref is assumed to be a small current, which is sufficient for one DMOS device, if a single DMOS transistor is only provided within the reference cell portion 20, as shown in FIG. 1. The reference potential generation portion 40 receives in parallel this reference current Iref at two circuits similar to the data detection portion 30, and generates a reference potential having a value between the H and L levels of the amplitude Vsa of the output from the data detection portion 30. As a result, current detection is possible when the data cell portion 10 has a single DMOS transistor. The data detection portion 30 outputs either the H or L level of the output Vsa according to whether there is a cell current Icell, using the reference voltage Vref as the reference potential.

The limiting current Ilim is assumed to be the current flowing when the second reference cell portion 50 has two or more DMOS transistors, as shown in FIG. 1, or when the second reference cell portion 50 has DMOS transistors less than half the total number n of memory cells in the reference cell portion. The current-limiting potential generation portion 90 generates a current-limiting potential Vlim from a limiting current Ilim between the minimum cell current Icell (in case of one DMOS device) and the maximum cell current Icell (in case of all-DMOS device). By this means, the current-limiting potential Vlim assumes a value close to the threshold of the current-limiting transistor TrL. That is, when the cell current Icell flows through the current-limiting transistor TrL, a potential difference appears across the drain side (data cell side) and source side (current detection portion side) of the current-limiting transistor TrL. When the cell current Icell in the current-limiting transistor TrL increases, the source-side voltage rises. Because the gate voltage is held constant by the current-limiting potential Vlim, the gate-source voltage of the current-limiting transistor TrL falls below the threshold value of the current-limiting transistor TrL when a cell current Icell greater than a certain value flows. Consequently, the cell current Icell is limited and is stabilized before the threshold value is reached.

When a current sufficient for the one DMOS device flows as the limiting current Ilim, the current-limiting potential Vlim entering the gate of the current-limiting transistor 1 is limited to that of the cell current Icell when one data cell is a DMOS transistor, because the current-limiting potential generation portion 90 generates a current-limiting potential Vlim in a circuit with the same construction as the data detection portion 30. In actuality, due to variations in the cell current Icell and in order to secure an operating margin, it is appropriate that the number of DMOS transistors within the second reference cell portion 50 be kept to from 3 to 8 in the case of 16 NAND cells (i.e., when a single block forming a data cell portion comprises 16 data cells).

Figure 2:
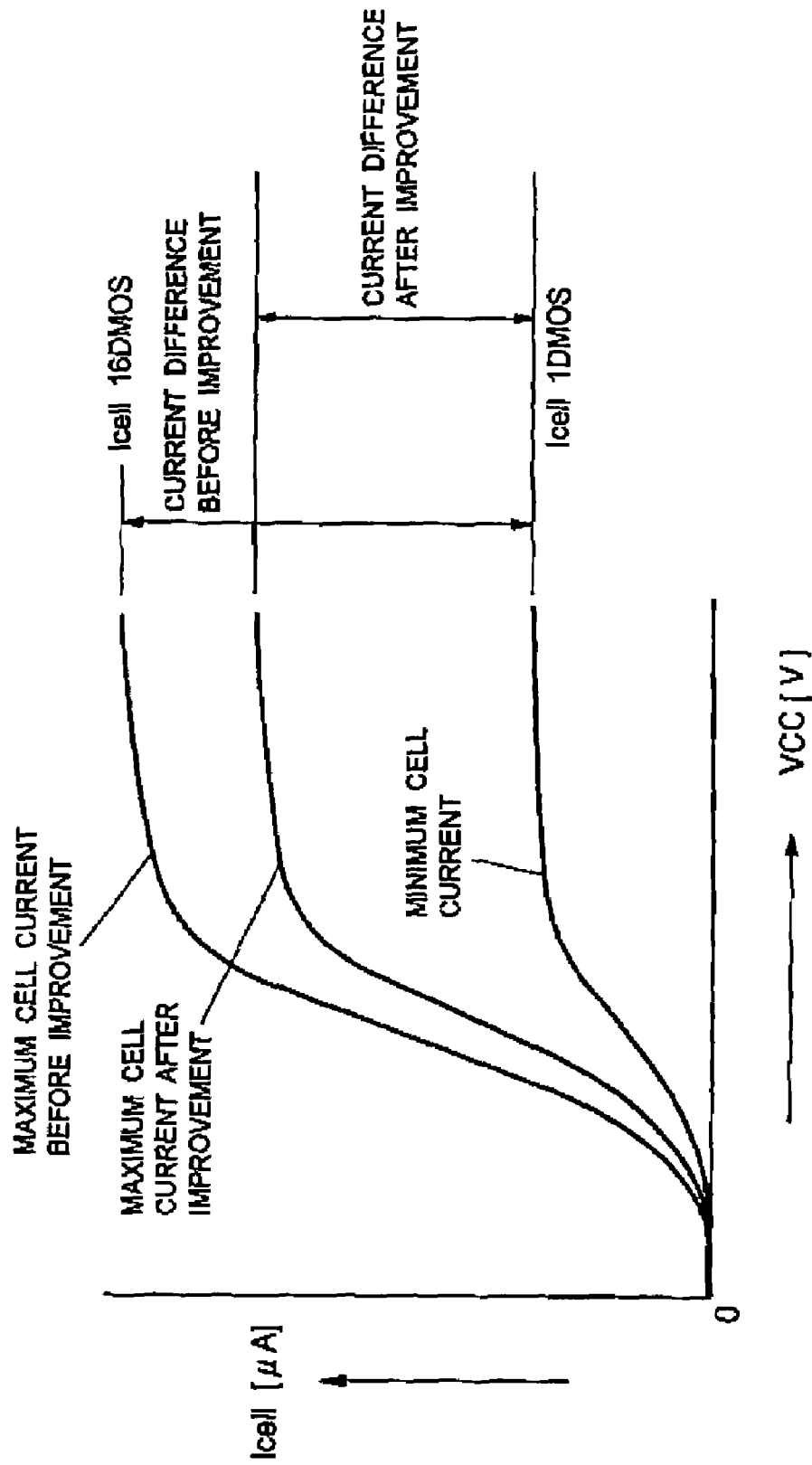
FIG. 2 is a graph showing the change in cell current with power supply voltage in the semiconductor storage apparatus shown in FIG. 1.

FIG. 2 shows changes in the cell current Icell in the semiconductor storage apparatus 1 shown in FIG. 1. The figure shows the minimum cell current, the maximum cell current and the improved maximum cell current (improved by this invention), particularly at the stable stage when the cell current enters the saturated state with respect to changes in the VCC voltage. In this embodiment, the minimum cell current is given when the 16 data cells constituting the data cell portion 10 have one DMOS transistor. On the other hand, the maximum cell current is given when all of the 16 data cells constituting the data cell portion 10 have DMOS transistors. It is understood from FIG. 2 that the difference between the minimum cell current and the maximum cell current is greatly decreased in the semiconductor storage apparatus 1 (after improvement), as compared with a conventional semiconductor storage apparatus (before improvement).

Thus in the first embodiment, variations in the cell current Icell are limited (controlled) because the cell current Icell introduced to the data detection portion 30 is restricted by the current-limiting transistor TrL and the current-limiting potential generation portion 70 which generates the gate input (that is, the current-limiting potential Vlim) for the transistor TrL. As a result, the amplitude of the output of the data detection portion 30 is reduced, undershoot and overshoot are prevented, and the access speed is improved. By reducing the differences in the cell current Icell flowing into the data detection portion 30, an optimal reference value can be set for the data detection circuit 30.

In this embodiment, it is preferable that the current-limiting transistor TrL be connected in series between the data cell portion 10-1 and column decoder 60, but the transistor TrL may be connected between the column decoder 60 and data detection portion 30.

Second Embodiment

Figure 3:
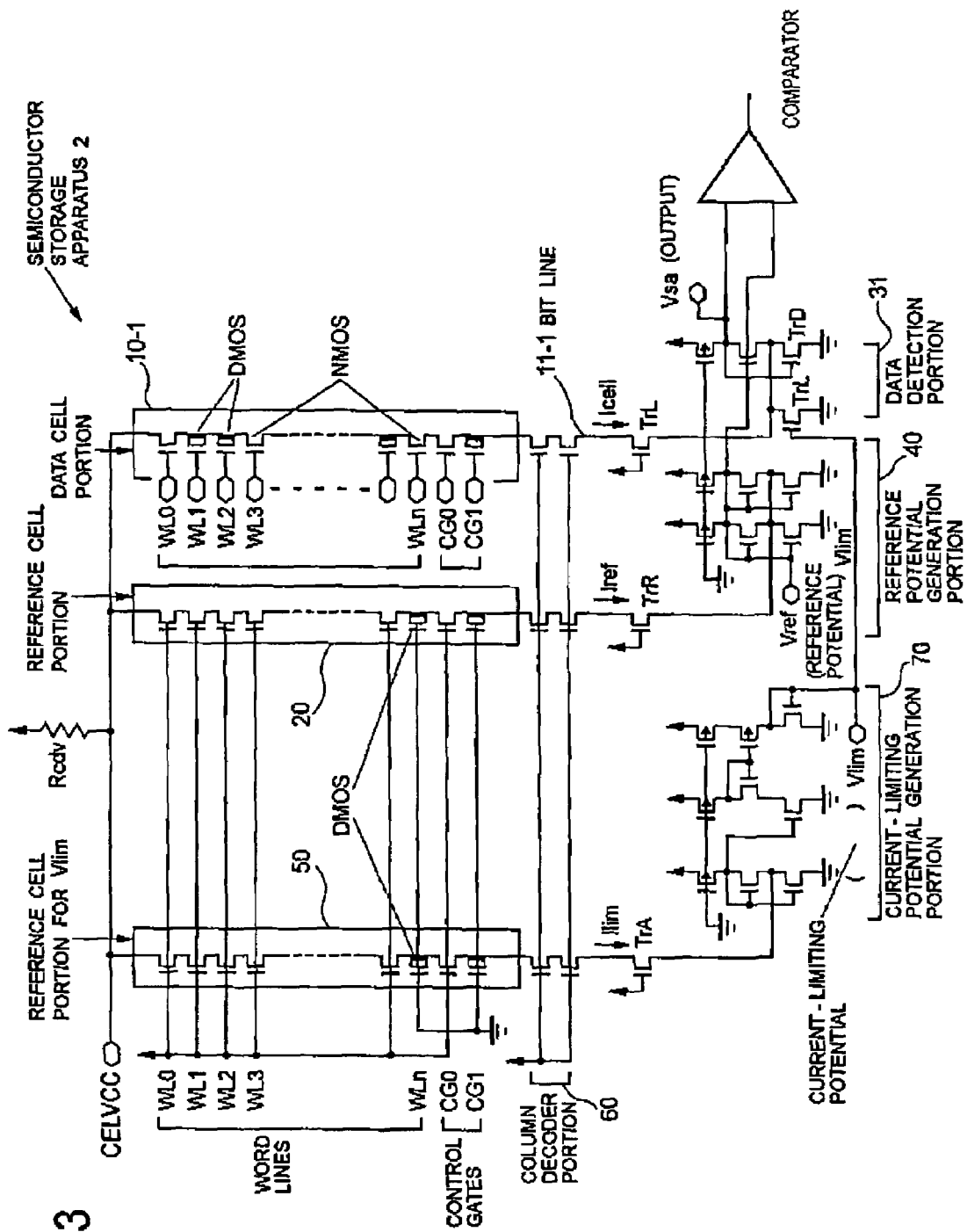
FIG. 3 is a circuit diagram showing the circuit configuration of a semiconductor storage apparatus in a second embodiment of this invention.

Referring to FIG. 3, the configuration of the semiconductor storage apparatus 2 according to a second embodiment is described. The semiconductor storage apparatus 2 has a similar configuration to the semiconductor storage apparatus 1 of the above-described first embodiment. Hence only different portions are described below. Similar reference numerals and symbols are used to designate similar elements in the first and second embodiments.

One end of the data cell portion 10-1 is connected to the cell power supply CELLVCC. The other end of the data cell portion 10-1 is connected to the bit line 11-1. The bit line 11-1 is connected, via the column decoder portion, to the drain of the transistor TrD in the data detection portion 31 and the drain of the current-limiting transistor TrL. The sources of the transistor TrD and of the current-limiting transistor TrL are connected to a ground point GND. Accordingly, the cell current Icel from the data cell portion 10-1 via the bit line 11-1 is divided to the transistor TrD and the current-limiting transistor TrL. The current-limiting potential Vlim from the current-limiting potential generation circuit 70 is supplied to the gate of the current-limiting transistor TrL. In this way, the current-limiting potential generation portion 70 and current-limiting transistor TrL form a current-limiting circuit.

The operation of the semiconductor storage apparatus 2 of the second embodiment is described referring to FIG. 3. The operation of the reference potential generation portion 40 and data detection portion 31 are the same as in the first embodiment, and so the description thereof is omitted. Upon receiving the limiting current Ilim, the current-limiting potential generation portion 70 generates a current-limiting potential Vlim, and supplies this potential Vlim to the gate of the current-limiting transistor TrL. The current-limiting transistor TrL, provided between the bit line 11-1 and ground point GND, passes a portion of the cell current Icell flowing from the bit line 11-1 to the ground point GND, and passes the remainder of the cell current Icell to the transistor TrD.

The value of the current-limiting potential Vlim is determined by the number of DMOS transistors within one block forming the current-limiting reference cell portion 50. Here the current-limiting potential Vlim increases with the number of DMOS transistors, as in the first embodiment. In the second embodiment, the transistor TrD and current-limiting transistor TrL are grounded in parallel, so that when the current-limiting potential Vlim is high, the cell current Icell is all passed to the current-limiting transistor TrL, without entering the transistor TrD of the data detection portion 31. Consequently the detection of the cell current Icell is not possible. To avoid this in the second embodiment, the number of DMOS transistors within the data cell portion for the limiting current Ilim is, for example, one, as shown in the figure, to make the current-limiting potential Vlim low. In case of single DMOS transistor structure, the cell current Icell is the minimum current. If the minimum current is not properly divided, the "H" current margin is reduced. To avoid this in the second embodiment, the mutual conductance $g_m$ of the current-limiting transistor TrL to which the current-limiting potential Vlim is applied is made half or less than that of the transistor TrD of the data detection portion. That is, the drain current of the transistor TrD is made greater than the drain current of the current-limiting transistor TrL.

When the data changes from "H" output to "L" output during switching of the word line WL, the charge accumulated on the bit line can be taken up by the transistor TrD and the current-limiting transistor TrL.

Thus in the second embodiment, when a large cell current Icell flows due to a large number of DMOS transistors provided in the data cell portion 10, the cell current Icell is distributed to the current-limiting transistor TrL, so that inflow of excessive current to the data detection portion 31 can be prevented. Thus, an advantageous result similar to that of the first embodiment is obtained.

Figure 4:
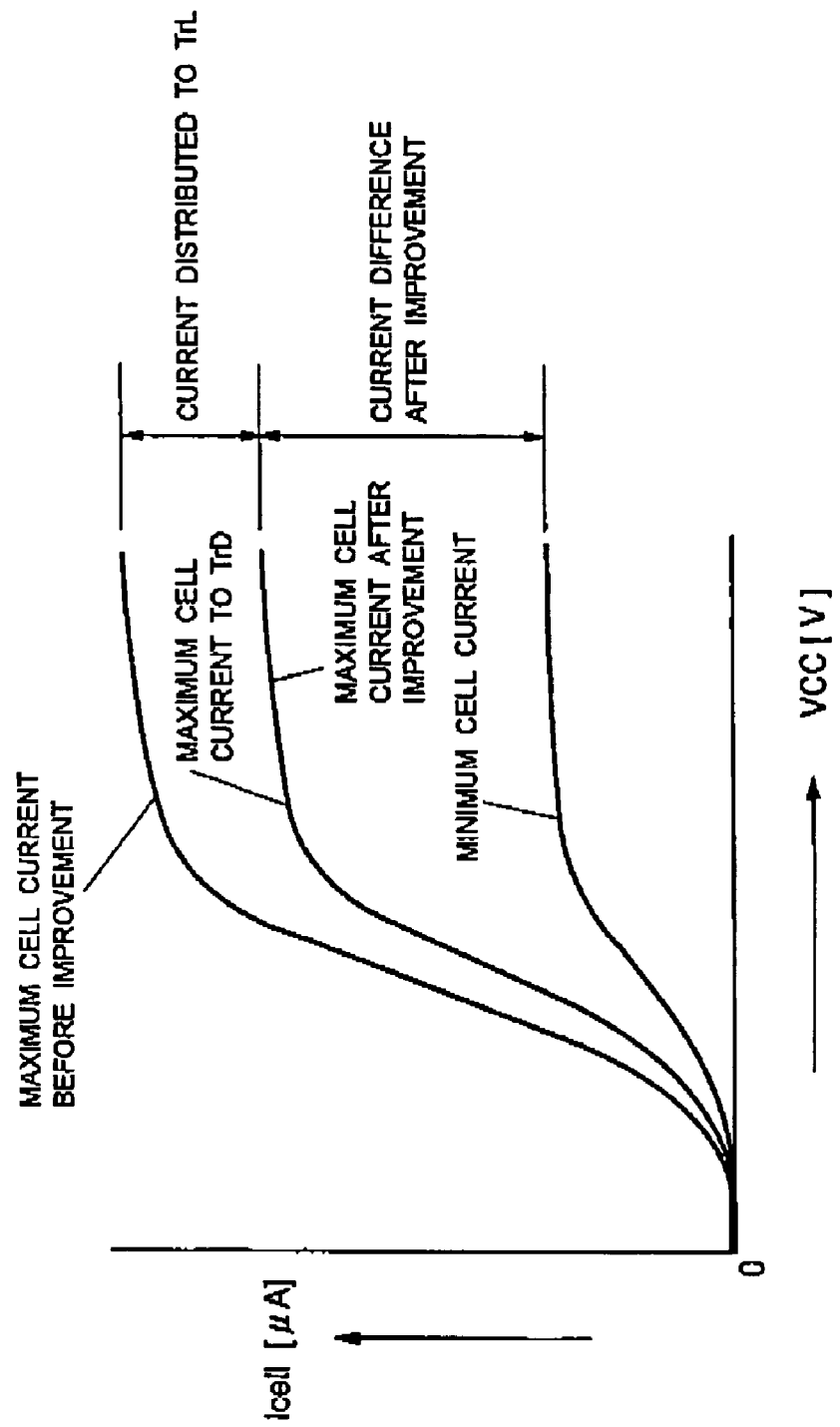
FIG. 4 is a graph showing the change in cell current with power supply voltage in the semiconductor storage apparatus shown in FIG. 3.

FIG. 4 shows the changes in cell current in the semiconductor storage apparatus 2 shown in FIG. 3. The figure shows the minimum cell current, the maximum cell current of a conventional semiconductor storage apparatus (before improvement) and the decreased maximum cell current of the semiconductor storage apparatus 2 (after improvement). Particularly, the diagram of FIG. 4 indicates the drop of the maximum current at the stable voltage (i.e., when the cell current enters the saturated state with respect to the changing VCC voltage). In the figure, the minimum cell current is given when the 16 data cells constituting the data cell portion 10 have one DMOS transistor. The maximum cell current is given when all of the 16 data cells constituting the data cell portion 10 have DMOS transistors. It is seen that in the semiconductor storage apparatus 2, the maximum cell current is reduced to the current difference after improvement by the amount of current distributed to the transistor TrL.

Figure 5:
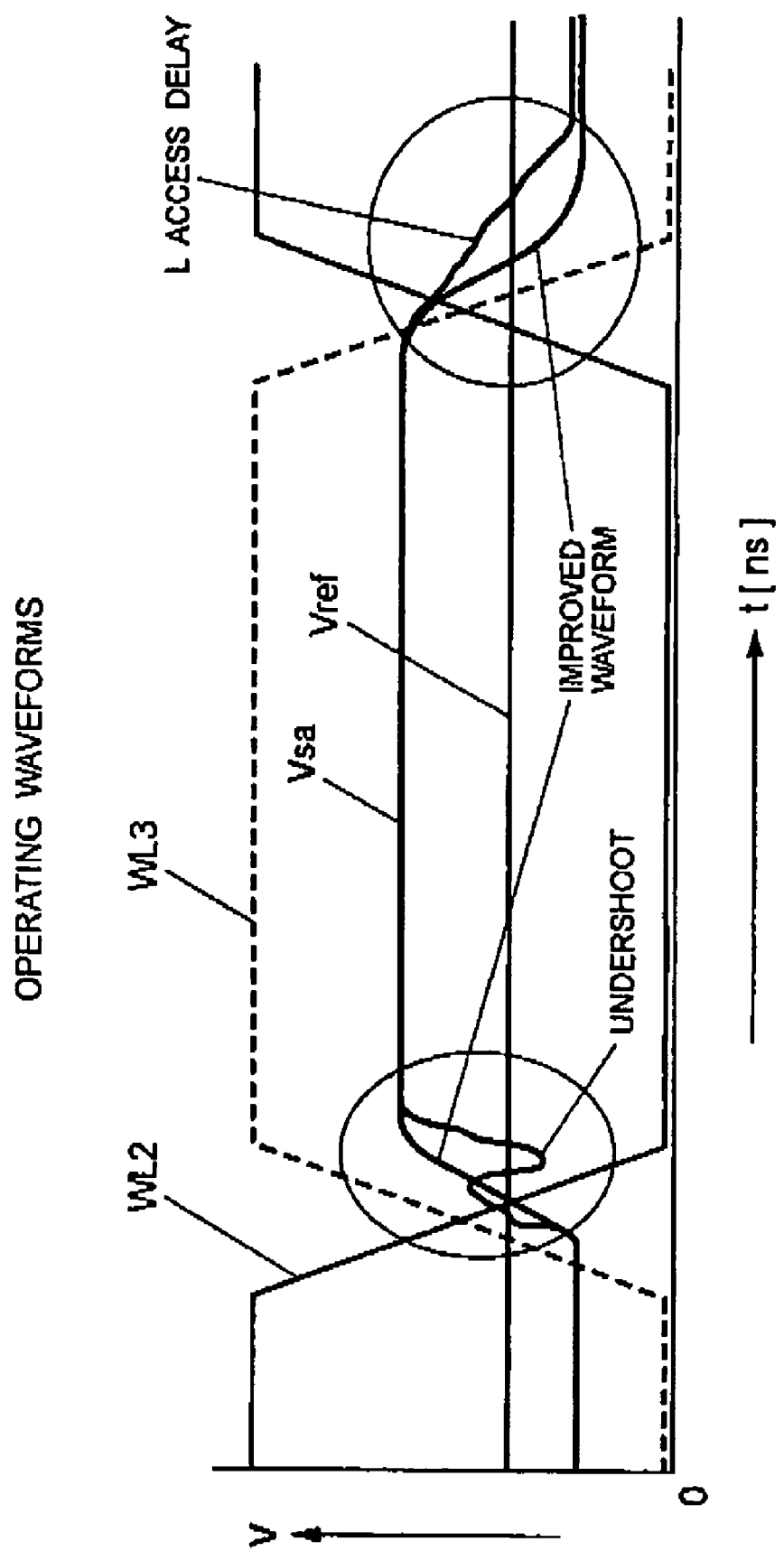
FIG. 5 is a waveform diagram showing the changes with time in the word line voltage and output voltage in the semiconductor storage apparatus shown in FIG. 3.

FIG. 5 shows the operating waveforms of the semiconductor storage apparatus 2 shown in FIG. 3. Changes in the output Vsa, when the word line WL3 is selected subsequent to the world line WL2, are shown. The rise of the output Vsa is smooth without the occurrence of undershooting, and the falling edge of the output Vsa attenuates rapidly, without a lag which might cause access delays.

In addition, in the second embodiment it is possible to eliminate an L access delay when bit lines become longer (i.e., when the bit line capacitance increases) as the memory capacity of the semiconductor storage apparatus is increased. The "L access delay" is a phenomenon in which, during output switching from "H" to "L", the output Vsa does not become "L" until the charge accumulated in the bit line is removed by the transistor TrD of the data detection portion 31. The current-limiting transistor TrL of this embodiment can perform, in combination with the transistor TrD, the discharging of this accumulated charge. In other words, the transistor TrL can assist the transistor TrD in discharging the accumulated charge.

Third Embodiment

Figure 6:
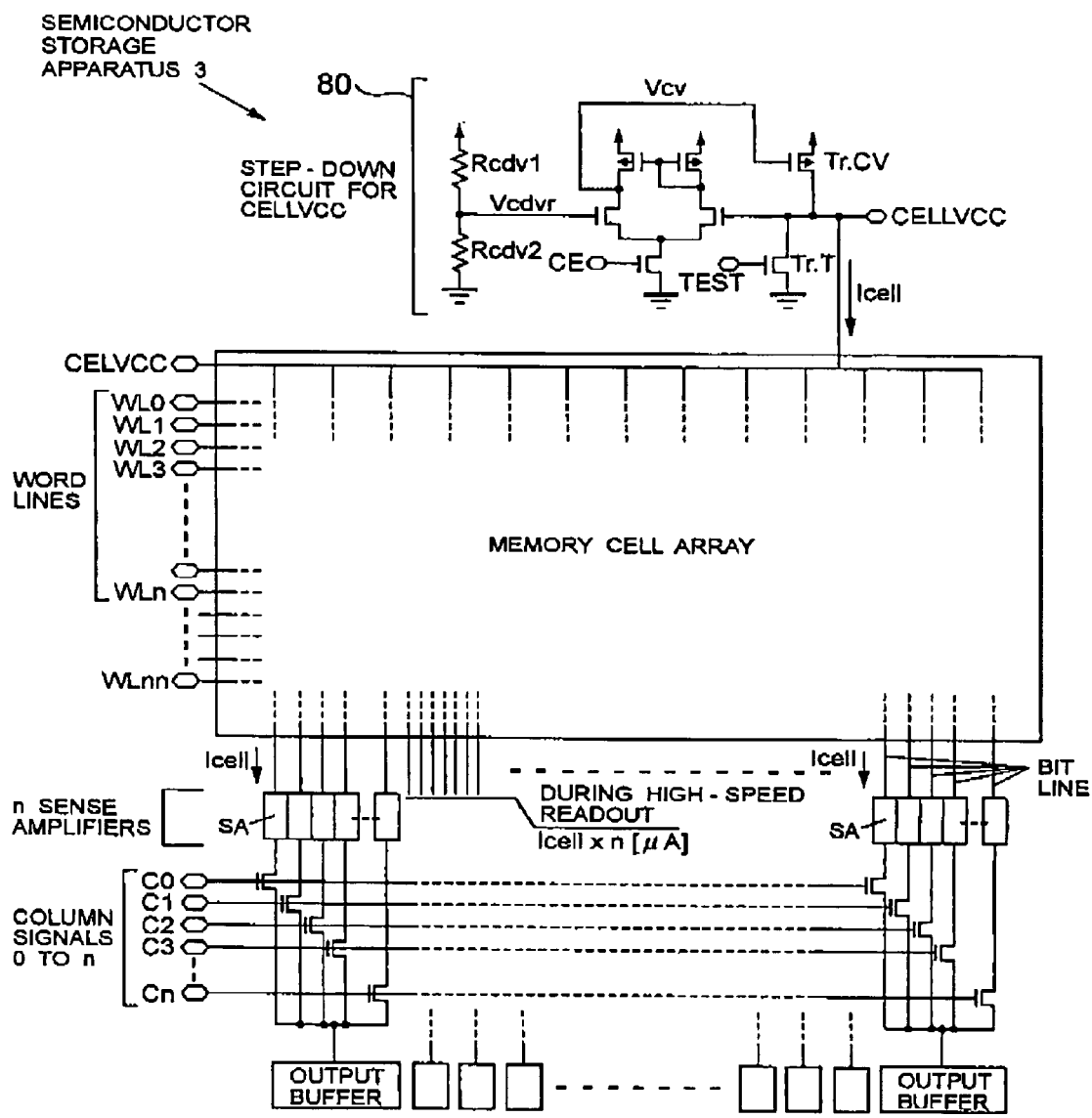
FIG. 6 is a circuit diagram showing the circuit configuration of a semiconductor storage apparatus in a third embodiment of this invention.
Figure 7:
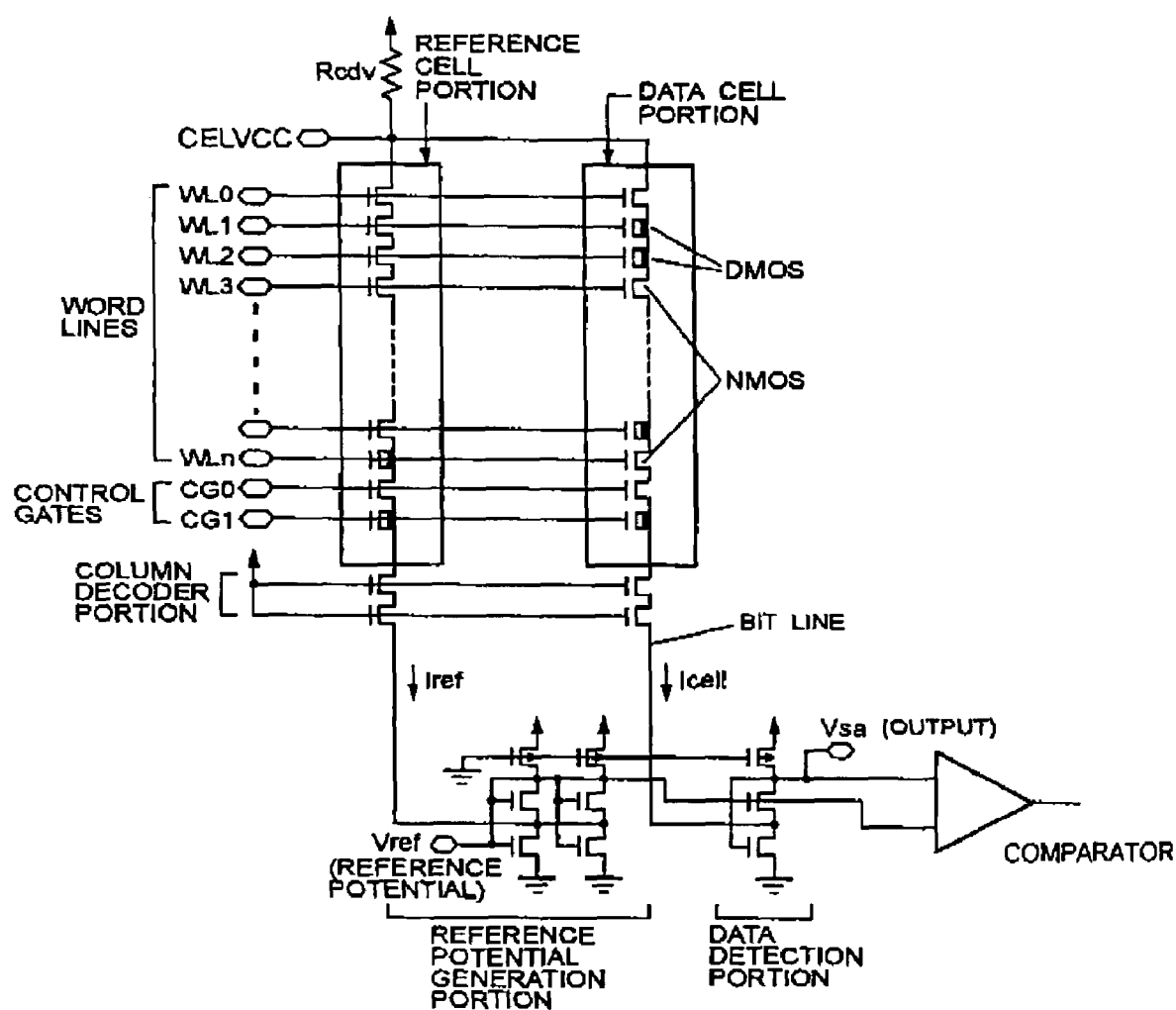
FIG. 7 is a circuit diagram showing the configuration of a conventional NAND-type nonvolatile semiconductor storage apparatus.
Figure 8:
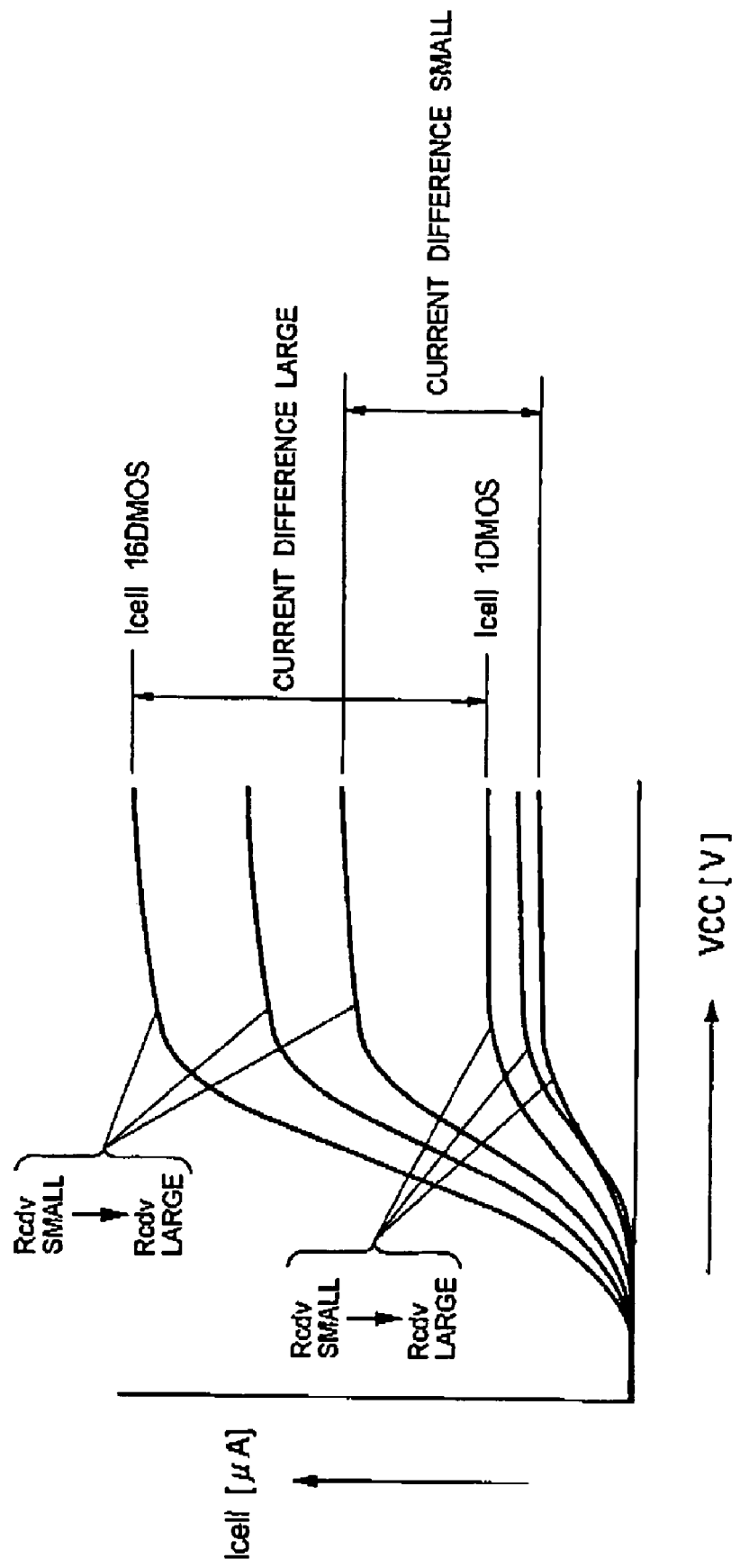
FIG. 8 is a graph showing the changes in cell current of the semiconductor storage apparatus shown in FIG. 7; and, FIG. 9 is a waveform diagram showing the changes with time in the word line voltage and output voltage in the semiconductor storage apparatus shown in FIG. 7.
Figure 9:
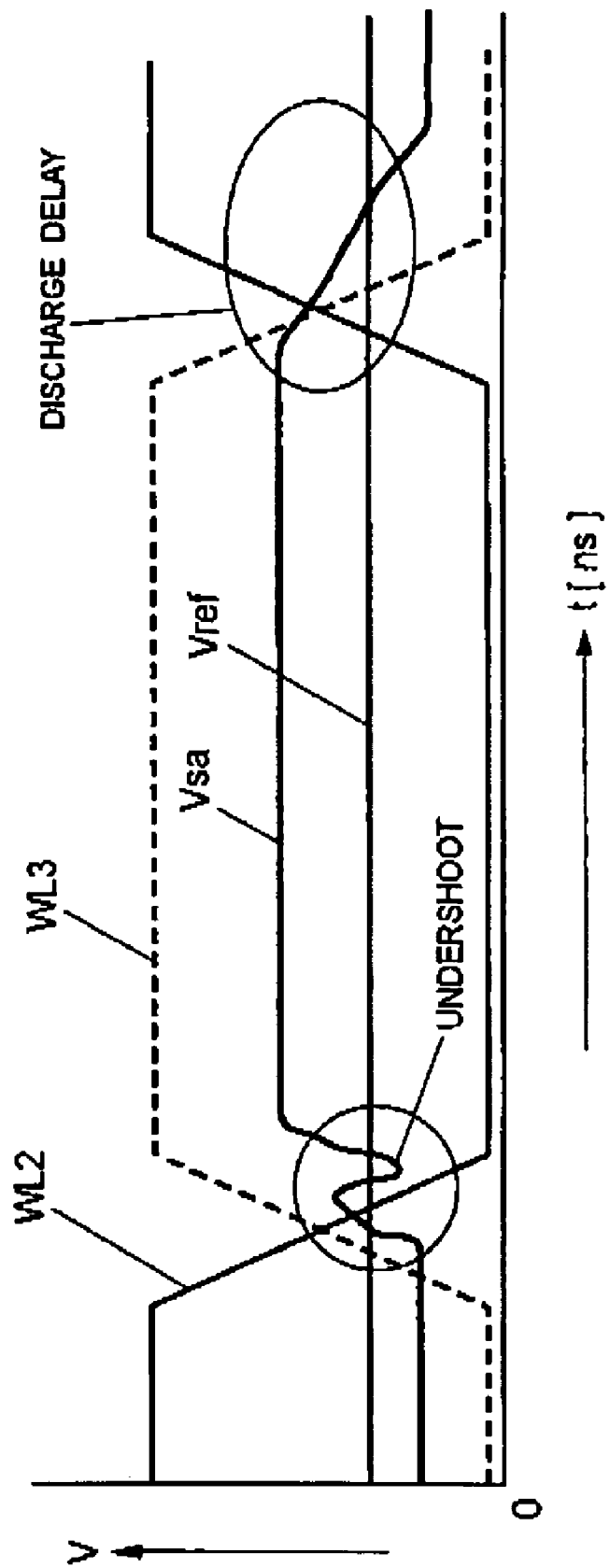

FIG. 6 shows the circuit configuration of the semiconductor storage apparatus 3 of a third embodiment. The semiconductor storage apparatus 3 has n amplifiers SA for column addresses, to accommodate high-speed data readout functions, and is configured to read data of a plurality of column addresses at high speed in response to the column signals C0 to Cn. Each of the amplifiers SA is provided with a data detection circuit similar to that in the first and second embodiments and including an output buffer. Power is supplied to the data cell array in the semiconductor storage apparatus 3 by a step-down circuit 80 which supplies the cell voltage CELLVCC. The step-down circuit 80 employs a current-mirror type reference potential generation circuit to output an arbitrary (desired) voltage below the power supply voltage VCC. This reference potential generation circuit generates the reference voltage Vcdvr by resistive division using the resistance Rcdv1 and resistance Rcdv2. The reference voltage Vcdvr is input to the current mirror amplifier, and the output of the current mirror amplifier controls the transistor TrCV to regulate the cell voltage CELLVCC. Through control by the transistor TrCV, the cell supply voltage CELLVCC can be maintained substantially equal to the reference voltage Vcdvr, and voltage is supplied only to data cells. Other circuit configuration of the semiconductor storage apparatus 3 is the same as the circuit configuration in the first embodiment.

Operation in the semiconductor storage apparatus 3 is now described. In the high-speed data readout mode, the n amplifiers each receive a cell current Icell and data is finalized. If data is all at "H" level, a current equal to cell current Icell×n (µA) flows, and power consumption is the worst possible; but the step-down circuit 80 maintains the cell supply voltage CELLVCC and supplies the current. As a result, data finalized for each amplifier is output serially through column address selection, and high-speed readout is realized.

Thus in the third embodiment, in contrast with the first and second embodiments, the cell supply voltage CELLVCC is not set using the fixed resistances, but is set using the step-down circuit. The voltage step-down using the resistances can reduce the difference between the maximum cell current Icell and minimum cell current Icell so that the amplifier reference value can easily be set to the optimal value; but in high-speed readout or at other times, the fixed resistances are sometimes insufficient because the cell current Icell flows to n amplifiers simultaneously. Specifically, when the fixed resistances are used, the voltage drop is large and it becomes difficult to read the "H" level. By using a step-down circuit with adequate supply capacity, as in this embodiment, the difference in "H" readout currents can be suppressed while enabling high-speed readout. The step-down circuit 80 in this embodiment can suppress the maximum cell current Icell and reduce current differences without adding a circuit for trimming to an arbitrary level.

In the above described embodiments, the present invention is applied to a nonvolatile memory using DMOS transistors; but a semiconductor storage apparatus of this invention is not limited to use of DMOS transistors. For example, a nonvolatile memory may have ROM data patterned thereon, depending upon the presence or absence of contact(s) and metal layer(s). In such cases, the difference between the cell current Icell and the maximum cell current is large when the "H" level is selected, so that an even greater advantageous result is expected.

This application is based on a Japanese patent application No. 2003-349292 filed Oct. 8, 2003, and the entire disclosure thereof is incorporated herein by reference.

What is claimed is:

1. A semiconductor storage apparatus comprising:
   a memory cell array having a plurality of data cells arranged in a plurality of rows and a plurality of columns, the plurality of data cells including a plurality of MOS transistors having different types of operating characteristics to store data according to said types, said MOS transistors in each column being connected to each other in series such that a source of one said MOS transistor is coupled to a drain of next said MOS transistor;
   a plurality of bit lines, each said bit line being defined by said MOS transistors in each said column, a cell current flowing in each said bit line;
   a readout circuit for reading said data from one of said data cells based on a cell current occurring in one of said bit lines;
   a reference bit line, a current-limiting current flowing in the reference bit line; and
   a current adjustment circuit for adjusting, in accordance with the current-limiting current in said reference bit line, the cell current flowing in one of the plurality of bit lines.

2. The semiconductor storage apparatus according to claim 1, wherein said current adjustment circuit includes a transistor having a drain, a source and a gate such that the drain and source are connected so as to suppress the cell current flowing in said one of the plurality of bit lines, and the gate is supplied with a potential according to the current-limiting cell current of said reference bit line.

3. The semiconductor storage apparatus according to claim 1, wherein said current adjustment circuit includes a transistor having a drain, a source and a gate such that the drain and source are connected so as to distribute the cell current flowing in said one of the plurality of bit lines to another element, and the gate is supplied with a potential according to the current-limiting current of said reference bit line.

4. The semiconductor storage apparatus according to claim 2, wherein said different types of operating characteristics are two types of operating characteristics which are an NMOS-type transistor operating characteristic and a DMOS-type transistor operating characteristic.

5. The semiconductor storage apparatus according to claim 3, wherein said different types of operating characteristics are two types of operating characteristics which are an NMOS-type transistor operating characteristic and a DMOS-type transistor operating characteristic.

6. A method of reading data from a semiconductor storage apparatus based on a cell current appearing on one of a plurality of bit lines of the semiconductor storage apparatus, the semiconductor storage apparatus including:
   a memory cell array having a plurality of data cells arranged in a plurality of rows and a plurality of columns, the plurality of data cells including a plurality of MOS transistors respectively, the plurality of MOS transistors having different types of operating characteristics to store data according to said types, said MOS transistors in each column being connected to each other in series such that a source of one said MOS transistor is coupled to a drain of next said MOS transistor;
   a reference bit line, a current-limiting current flowing in the reference bit line;
   wherein the plurality of bit lines, each said bit line being defined by said MOS transistors in each said column such that a cell current flows in each said bit line;
   said method comprising:
   adjusting the cell current flowing in the one of the plurality of bit lines in accordance with the current-limiting current flowing in said reference bit line.

7. The method according to claim 6, wherein said adjusting the cell current includes reducing the cell current flowing in said one of the plurality of bit lines in accordance with the current-limiting current flowing in said reference bit line.

8. The method according to claim 7, wherein said different types of operating characteristics are two types of operating characteristics which are an NMOS-type transistor operating characteristic and a DMOS-type transistor operating characteristic.

* * * * *